US011509326B2

(12) United States Patent
Brule et al.

(10) Patent No.: US 11,509,326 B2
(45) Date of Patent: Nov. 22, 2022

(54) SIGMA-DELTA ANALOGUE TO DIGITAL CONVERTER

(71) Applicant: NXP USA, Inc., Austin, TX (US)

(72) Inventors: Simon Brule, Toulouse (FR); Thierry Dominique Yves Cassagnes, Tournefeuille (FR); Pascal Sandrez, Toulouse (FR); Soufiane Serser, Toulouse (FR)

(73) Assignee: NXP USA, Inc., Austin, TX (US)

( * ) Notice: Subject to any disclaimer, the term of this patent is extended or adjusted under 35 U.S.C. 154(b) by 38 days.

(21) Appl. No.: 17/322,212

(22) Filed: May 17, 2021

(65) Prior Publication Data

US 2021/0399738 A1 Dec. 23, 2021

(30) Foreign Application Priority Data

Jun. 19, 2020 (EP) .................................. 20305675

(51) Int. Cl.
*H03M 3/00* (2006.01)
*B60L 58/10* (2019.01)
*H03F 3/45* (2006.01)

(52) U.S. Cl.
CPC ............ *H03M 3/458* (2013.01); *B60L 58/10* (2019.02); *H03F 3/45179* (2013.01); *H03M 3/438* (2013.01)

(58) Field of Classification Search
CPC ...... H03M 3/458; H03M 3/438; H03M 3/322; H03M 3/494; B60L 58/10; H03F 3/45179;
(Continued)

(56) References Cited

U.S. PATENT DOCUMENTS 5,293,169 A * 3/1994 Baumgartner ........ H03M 3/398
341/172
6,486,821 B1 * 11/2002 Aude ...................... H03F 1/086
341/172
(Continued)

FOREIGN PATENT DOCUMENTS

KR 101280876 B1 7/2013

OTHER PUBLICATIONS

Kadirvel et al., "A Stackable, 6-Cell, Li-Ion, Battery Management IC for Electric Vehicles With 13, 12-bit [Sigma] [Delta] ADCs, Cell Balancing, and Direct-Connect Current-Mode Communications", IEEE Journal of Solid-State Circuits, Apr. 1, 2014, vol. 49, No. 4, 7 pages.
(Continued)

*Primary Examiner* — Jean B Jeanglaude

(57) ABSTRACT

A sigma-delta ADC comprising: a first-input-terminal configured to receive a first-high-voltage-analogue-input-signal; a second-input-terminal configured to receive a second-high-voltage-analogue-input-signal; an output-terminal configured to provide an output-digital-signal, wherein the output-digital-signal is representative of the difference between the first-high-voltage-analogue-input-signal and the second-high-voltage-analogue-input-signal. The sigma-delta ADC also includes a feedback-current-block, which comprises: a first-feedback-transistor having a conduction channel; a second-feedback-transistor having a conduction channel; a first-feedback-switch; a second-feedback-switch; a first-feedback-current-source; and a second-feedback-current-source.

20 Claims, 6 Drawing Sheets

(58) Field of Classification Search
CPC ..... H03F 2200/331; H03F 2203/45101; H03F 2203/45438; H03F 2203/45512; H03F 2203/45586; H03F 3/45475; H03F 3/45928; Y02T 10/70
USPC .......................................................... 341/143
See application file for complete search history.

(56) References Cited

U.S. PATENT DOCUMENTS

| | | | |
|---|---|---|---|
| 7,009,541 B1 | 3/2006 | Nguyen | |
| 8,497,793 B2* | 7/2013 | Lu | H03M 3/34 341/143 |
| 8,791,848 B2* | 7/2014 | Ho | H03M 3/458 341/120 |
| 9,065,480 B1* | 6/2015 | Tseng | H03M 3/388 |
| 9,893,741 B2* | 2/2018 | Cao | H03M 3/468 |

OTHER PUBLICATIONS

Das et al., "A 4th-order 86dB CT [Delta][Sigma] ADC with Two Amplifiers in 90nm CMOS", Solid-State Circuits Conference, Digest of Technical Papers, Jan. 1, 2005, pp. 496-612, vol. 1, IEEE, 3 pages.

Altun et al., "A 6mW 480MHz Continous Time [Sigma][Delta] Modulator with 65dB DR over 5MHz Bandwidth in 65 nm CMOS", IEEE International Symposium on Circuits and Systems, May 30, 2010, pp. 3989-3992, IEEE, 4 pages.

* cited by examiner

Example of amplifier topology for the 1st integrator stage

SIGMA-DELTA ANALOGUE TO DIGITAL CONVERTER

FIELD

The present disclosure relates to sigma-delta analogue to digital converters (ADCs), and battery management systems (BMSs) that use such ADCs.

SUMMARY

According to a first aspect of the present disclosure there is provided a sigma-delta ADC comprising:
- a first-input-terminal configured to receive a first-high-voltage-analogue-input-signal;
- a second-input-terminal configured to receive a second-high-voltage-analogue-input-signal;
- an output-terminal configured to provide an output-digital-signal, wherein the output-digital-signal is representative of the difference between the first-high-voltage-analogue-input-signal and the second-high-voltage-analogue-input-signal;
- a first-amplifier-stage comprising:
  - a first-amplifier-first-input-terminal;
  - a first-amplifier-second-input-terminal;
  - a first-amplifier-first-output-terminal;
  - a first-amplifier-second-output-terminal;
  - a first-input-resistor connected in series between the first-input-terminal and the first-amplifier-first-input-terminal;
  - a second-input-resistor connected in series between the second-input-terminal and the first-amplifier-second-input-terminal;
  - a first-amplifier-first-transistor comprising:
    - a control-terminal, that is connected to the first-amplifier-first-input-terminal and is configured to receive a high-voltage first-amplifier-first-input-signal;
    - a first-conduction-channel-terminal, that is configured to be connected to a high-voltage supply;
    - a second-conduction-channel-terminal, that is configured to provide a low-voltage signal for setting the voltage at the first-amplifier-first-output-terminal;
  - a first-amplifier-second-transistor comprising:
    - a control-terminal, that is connected to the first-amplifier-second-input-terminal and is configured to receive a high-voltage first-amplifier-second-input-signal;
    - a first-conduction-channel-terminal, that is configured to be connected to a high-voltage supply;
    - a second-conduction-channel-terminal, that is configured to provide a low-voltage signal for setting the voltage at the first-amplifier-second-output-terminal; and
- a first-integration-capacitor connected between the first-amplifier-first-output-terminal and the first-amplifier-first-input-terminal;
- a second-integration-capacitor connected between the first-amplifier-second-output-terminal and the first-amplifier-second-input-terminal;
- a threshold-block that is configured to:
  - receive signals from the first-amplifier-first-output-terminal and the first-amplifier-second-output-terminal; and
  - provide the output-digital-signal to the output-terminal; and
- a feedback-current-block, which comprises:
  - a first-feedback-transistor having a conduction channel;
  - a second-feedback-transistor having a conduction channel;
  - a first-feedback-switch;
  - a second-feedback-switch;
  - a first-feedback-current-source; and
  - a second-feedback-current-source;
  - wherein:
    - each of the following components is connected in series between the first-amplifier-first-input-terminal and a reference-terminal: the conduction channel of the first-feedback-transistor; the first-feedback-switch; and the first-feedback-current-source; and
    - each of the following components is connected in series between the first-amplifier-second-input-terminal and the reference-terminal: the conduction channel of the second-feedback-transistor; the second-feedback-switch; and the second-feedback-current-source.

Such a sigma-delta ADC can be directly tied to individual battery cells. Advantageously the ADC can perform both: (i) the high voltage to low voltage level shifting; and (ii) the Analog to Digital Conversion of the cell voltage.

In one or more embodiments a high voltage is a voltage that is greater than or equal to 10V, 40V, 80V or 120V. In one or more embodiments a low voltage is a voltage that is less than or equal to 5V, 3V, 1.8V or 1V.

In one or more embodiments:
the first-feedback-transistor comprises a high voltage device; and
the first-feedback-current-source comprises a low voltage device.

In one or more embodiments:
the second-feedback-transistor comprises a high voltage device; and
the second-feedback-current-source comprises a low voltage device.

In one or more embodiments:
the first-amplifier-first-transistor comprises a first-amplifier-first-cascode; and
the first-amplifier-second-transistor comprises a first-amplifier-second-cascode.

In one or more embodiments:
the first-amplifier-first-cascode comprises a high voltage device and a low voltage device; and
the first-amplifier-second-cascode comprises a high voltage device and a low voltage device.

In one or more embodiments the first-amplifier-first-transistor and the first-amplifier-second-transistor are provided as a differential pair.

In one or more embodiments:
the first-amplifier-first-transistor comprises a pmos FET; and
the first-amplifier-second-transistor comprises a pmos FET.

In one or more embodiments:
the first-feedback-transistor comprises a nmos FET; and
the second-feedback-transistor comprises a nmos FET.

In one or more embodiments the first-feedback-switch and the first-feedback-current-source are both connected in series between: (i) a first terminal of the conduction channel of the first-feedback-transistor; and (ii) the reference-terminal. A second terminal of the conduction channel of the first-feedback-transistor may be connected to the first-amplifier-first-input-terminal. The second-feedback-switch and the second-feedback-current-source may be both connected in series between: (i) a first terminal of the conduction channel of the second-feedback-transistor; and (ii) the reference-terminal. A second terminal of the conduction channel of the second-feedback-transistor may be connected to the first-amplifier-second-input-terminal.

In one or more embodiments the sigma-delta ADC is a continuous-time ADC.

In one or more embodiments the sigma-delta ADC further comprises one or more further amplifier-stages provided in series with the first-amplifier-stage between (i) the first-input-terminal and the second-input-terminal, and (ii) the threshold-block.

There may be provided a battery management system for a vehicle, wherein the battery management system comprises any sigma-delta ADC disclosed herein.

There may be provided a vehicle comprising any battery management system disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

The Battery Management Systems (BMS) integrated circuits (ICs), in electrical cars, require the measurement of individual cells located in a stack of rechargeable battery cells. A challenge of this type of configuration is the high common mode voltage of the different cells, which can typically go up to a hundred volts.

Figure 1:
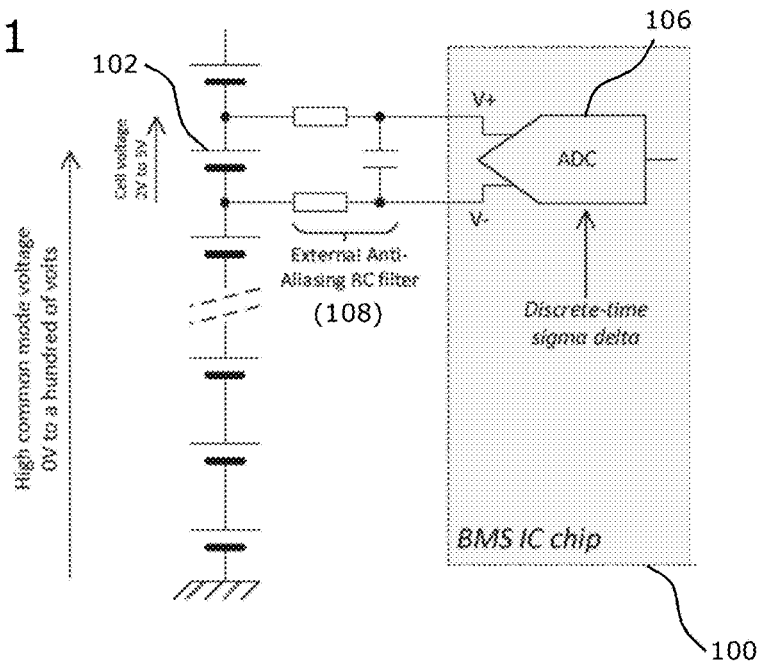
FIG. 1 shows a discrete-time sigma-delta ADC on a BMS IC.

FIG. 1 shows a discrete-time sigma-delta ADC 106 on a BMS IC 100. The BMS IC 100 is shown connected across a single cell 102 in a stack of cells. The voltage across the single cell 102 may be in the region of 2V to 5V. The common mode voltage across the entire stack may be considered as a high voltage, and may be up to about 100V in some examples. The sigma-delta ADC 106 has a high-voltage sampling capacitor (not shown) at its inputs. The high common-mode voltage present on the sampling capacitors can be level shifted from a high voltage to a low voltage using an input switching cap circuit, as will be described with reference to FIG. 2.

This discrete time approach, because the input signal is sampled on the sampling capacitors, necessitates the use of external anti-aliasing RC filters 108. Use of the anti-aliasing RC filters 108 increases the board level integration complexity and cost of the circuit, which is clearly undesirable.

Figure 2:
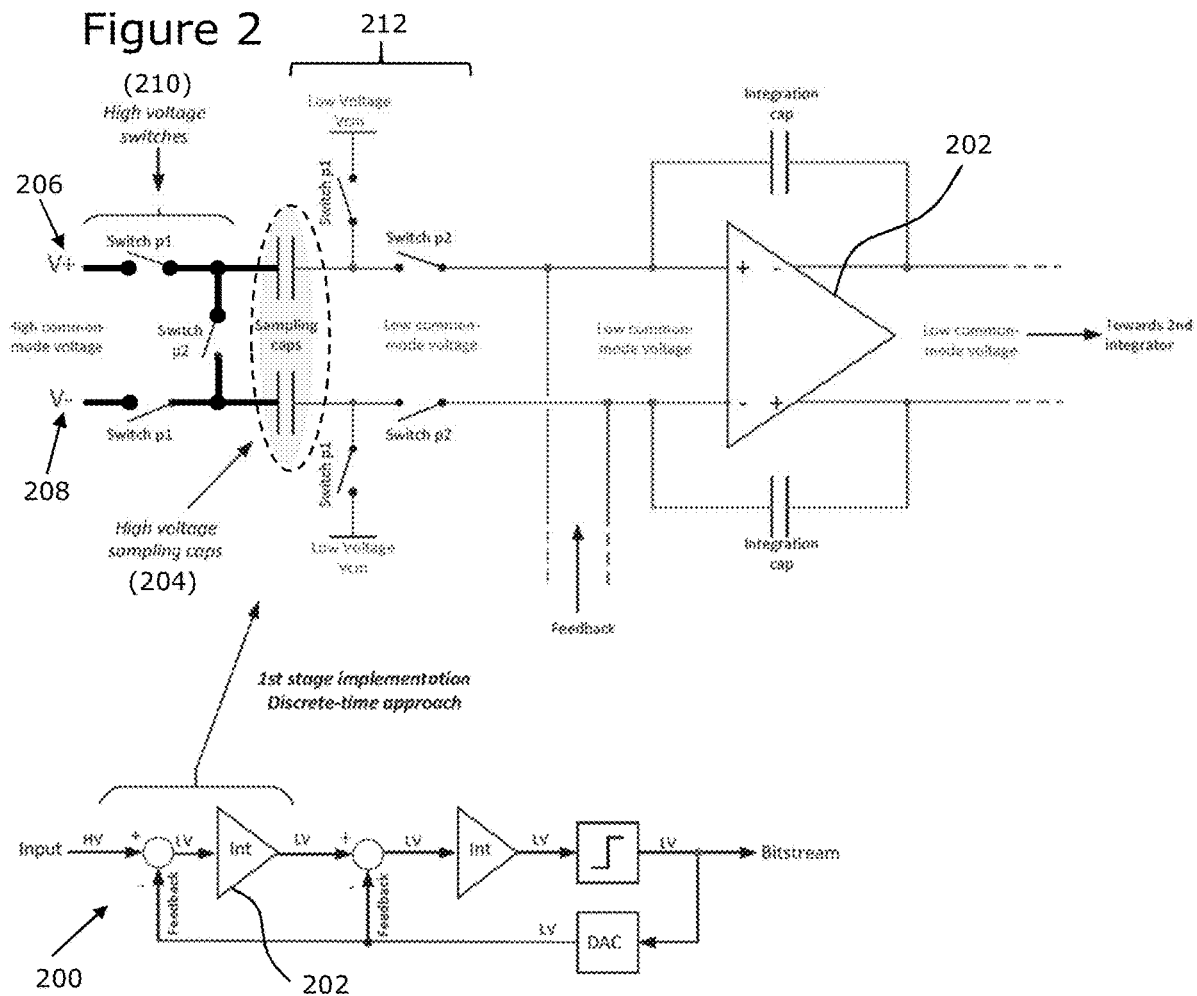
FIG. 2 illustrates an example of a discrete-time implementation of a second order sigma-delta ADC.

FIG. 2 illustrates an example of a discrete-time implementation of a second order sigma-delta ADC. This figure will be used to describe how the high voltage to low voltage level shifting happens in this type of topology. Branches of the circuit that carry high voltage signals are shown schematically as thick lines, and branches of the circuit that carry low voltage signals are shown schematically as thin lines.

The sigma-delta ADC receives high common-mode voltage input signals. More particularly, the sigma-delta ADC has a first-input-terminal 206 (V+) that receives a first-high-voltage-analogue-input-signal, and has a second-input-terminal 208 (V−) that receives a second-high-voltage-analogue-input-signal.

The sigma-delta ADC includes a switching network 210, which includes high voltage switches. These high voltage switches are used to selectively connect the first-input-terminal 206 (V+) and the second-input-terminal 208 (V−) to first plates of two sampling capacitors 204. These are the high-voltage sampling capacitors that were described with reference to FIG. 1. The second plates of the two sampling capacitors 204 are selectively connected to the input terminals of a first-amplifier-stage 202 by a second switching network 212. As indicated above, the sampling capacitors 204 are used to level shift the high common-mode voltages present at the first- and second-input-terminals 206, 208 to low common-mode voltages. Therefore, the second switching network 212 can be implemented using low voltage switches.

Figure 3:
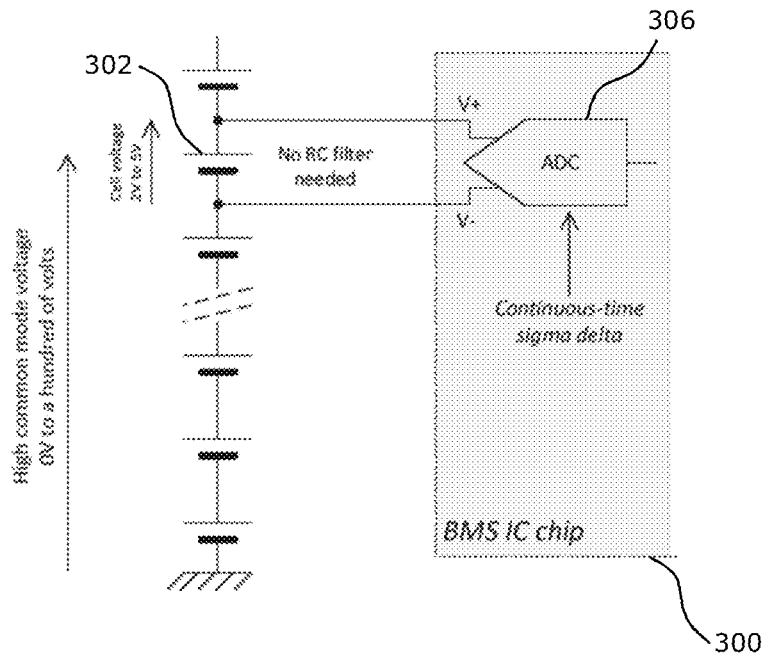
FIG. 3 shows a continuous-time sigma-delta ADC on a BMS IC.

FIG. 3 shows a continuous-time sigma-delta ADC 306 on a BMS IC 300. A continuous-time approach can avoid the need for sampling. This can be advantageous because it can negate the need for having to handle aliasing issues at multiples of a sampling frequency. The BMS IC 300 is again shown connected across a single cell 302 in a stack of cells. As can be seen from the drawing, the external anti-aliasing RC filters that were required for the discrete-time approach of FIG. 1 are not required for the continuous-time approach of FIG. 3. Also, as will be appreciated from the description that follows, the continuous-approach does not require the switched capacitor network that is shown in the discrete-time approach of FIG. 2.

Figure 4:
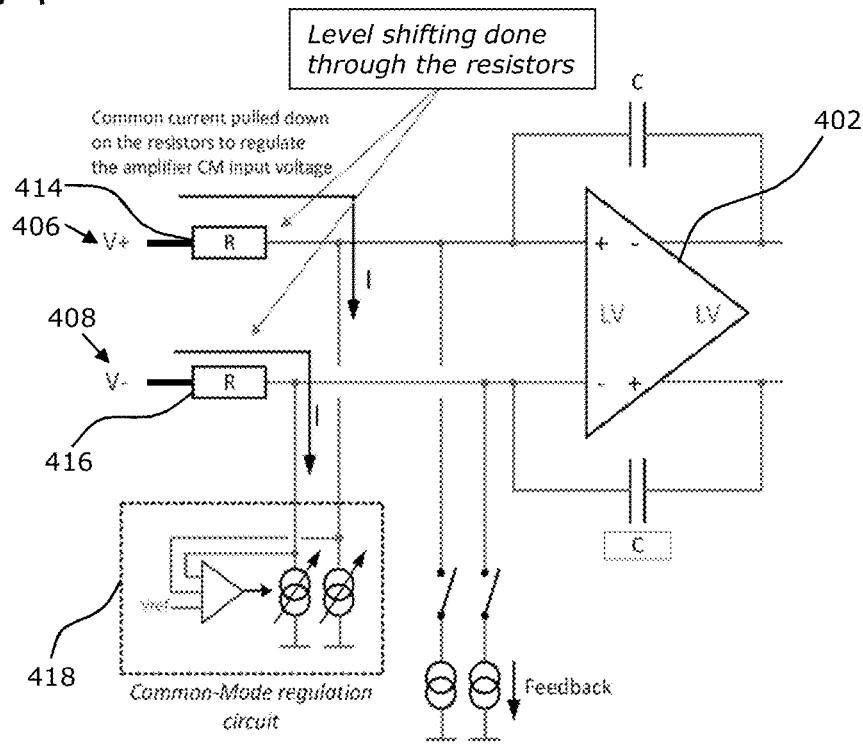
FIG. 4 shows one way of implementing a continuous-time sigma-delta ADC.

FIG. 4 shows one way of implementing a continuous-time sigma-delta ADC. As before (and elsewhere in this document), branches of the circuit that carry high voltage signals are shown schematically as thick lines, and branches of the circuit that carry low voltage signals are shown schematically as thin lines. The first- and second-input-terminals 406, 408 (V+, V−) receive high voltage signals, and provide those high voltage signals to first terminals of respective input resistors 414, 416. The level shifting of the common mode voltage is performed across the input resistors 414, 416, by pulling a common current through the input resistors 414, 416. As shown in FIG. 4, a common-mode regulation circuit 418 is used to provide the common current. This common current is pulled down through the input resistors 414, 416 to regulate the common-mode input voltage of the first-amplifier-stage 402.

The circuit of FIG. 4 offers a solution for small common-mode voltage differences between the ADC input-terminals 406, 408 and the internal amplifier-stage 402. However, the circuit of FIG. 4 is not suitable for the very high voltage inputs found in electrical vehicle applications. The reasons for this can include:
- the common mode regulation currents would have to be unfeasibly large; and
- the voltage across the input resistors 414, 416 would vary depending on the input common mode voltage, which would make the offset of the structure more complex to compensate.

Although circuits can push/pull a common current through the input resistors to compensate an input common-mode voltage, that would be a few volts higher or lower than the amplifier input. Therefore, such circuits are not suitable for high voltage signals.

As will be discussed in detail below, circuits of the present disclosure can perform level shifting from high voltages to low voltages directly inside the first-amplifier-stage. This can address one or both of the two drawbacks identified above.

Figure 5:
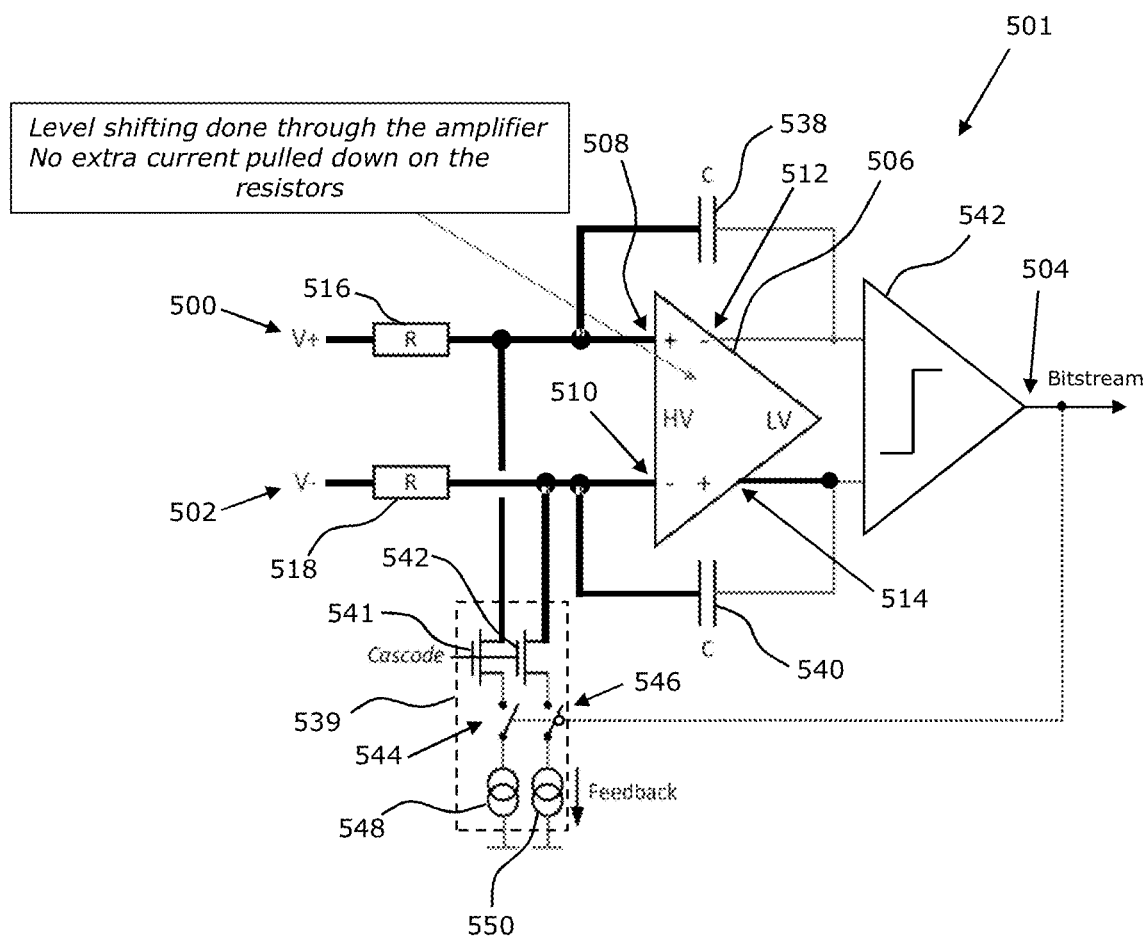
FIG. 5 shows an example embodiment of a first order sigma-delta ADC according to the present disclosure.

FIG. 5 shows an example embodiment of a sigma-delta ADC 501. The ADC 501 includes a first-input-terminal 500 (V+) and a second-input-terminal 502 (V−). The first-input-terminal 500 receives a first-high-voltage-analogue-input-signal, and the second-input-terminal 502 receives a second-high-voltage-analogue-input-signal. As shown in FIG. 3, the first-input-terminal 500 (V+) and the second-input-terminal 502 can be connected across a single cell in a stack of cells.

A high voltage signal, as it is described herein may be one that is greater than or equal to 10V, 40V, greater than or equal to 80V, greater than or equal to 90V, greater than or equal to 120V, or greater than or equal to 200V. It will be appreciated that the level of the high voltage signal can be determined by the technology that is used. In automotive applications, a voltage level that is greater than or equal to 10V is presently referred to as a high voltage. A high voltage signal may be one that is at a level that pure CMOS structures would not be able to handle because the voltage applied on the gates would exceed the maximum rating of the technology. A high voltage device is one that is capable of handling a high voltage signal.

A low voltage signal, as it is described herein, may be one that is less than or equal to 5V, 3V, less than or equal to 1.8V, or less than or equal to 1V. It will be appreciated that the level of the low voltage signal can also be determined by the technology that is used. In automotive applications, a standard CMOS technology that that has a voltage of less than or equal to 3V is presently referred to as a low voltage. A low voltage device is one that is suitable for handling a low voltage signal.

The ADC 501 also includes an output-terminal 504. The output-terminal 504 provides an output-digital-signal (Bitstream), which is representative of the difference between first-high-voltage-analogue-input-signal and the second-high-voltage-analogue-input-signal.

The ADC 501 includes a first-amplifier-stage 506, which may also be referred to as an integrator. In this example, the ADC 501 is a first-order ADC and therefore has only one amplifier-stage 506. However, it will be appreciated that additional amplifier-stages (integrators) can be used to provide a higher order ADC. For instance, a second order ADC will be described with reference to FIG. 6.

Returning to FIG. 5, the first-amplifier-stage 506 includes: a first-amplifier-first-input-terminal 508; a first-amplifier-second-input-terminal 510; a first-amplifier-first-output-terminal 512; and a first-amplifier-second-output-terminal 514.

The ADC includes a first-input-resistor 516 connected in series between the first-input-terminal 500 and the first-amplifier-first-input-terminal 508, and also a second-input-resistor 518 connected in series between the second-input-terminal 502 and the first-amplifier-second-input-terminal 510. These input-resistors 516, 518 can provide good robustness in terms of electrostatic discharge (ESD) and electromagnetic compatibility (EMC).

A first-integration-capacitor 538 is connected between the first-amplifier-first-output-terminal 512 and the first-amplifier-first-input-terminal 508. A second-integration-capacitor 540 is connected between the first-amplifier-second-output-terminal 514 and the first-amplifier-second-input-terminal 510. These integration-capacitors 538, 540 contribute to the first-amplifier-stage 506 operating as an integrator. As will be appreciated from the description that follows, these integration-capacitors 538, 540 are provided as high voltage components (in that they can function correctly with high voltage signals). This is because one of the plates of each of the integration-capacitors 538, 540 is provided with a high voltage signal. It can be seen for FIG. 5 that the other plate of each of the integration-capacitors 538, 540 is provided with a low voltage signal.

The ADC 501 also includes a threshold-block 542 that receives signals from the first-amplifier-first-output-terminal 512 and the first-amplifier-second-output-terminal 514, and provides the output-digital-signal (Bitstream) to the output-terminal 504. As is known in the art, the threshold-block 542 may be implemented as a comparator. In this example, the threshold-block 542 receives the signals directly from the first-amplifier-first-output-terminal 512 and the first-amplifier-second-output-terminal 514. However, it will be appreciated that in other examples one or more components may be connected in the circuit paths between the first-amplifier-first-output-terminal 512/first-amplifier-second-output-terminal 514 and the threshold-block 542. For instance, one or more further amplifier-stages (integrators) may be provided in the circuit paths between the first-amplifier-first-output-terminal 512/first-amplifier-second-output-terminal 514 and the threshold-block 542, yet the threshold-block 542 can still be considered as receiving signals from the first-amplifier-first-output-terminal 512 and the first-amplifier-second-output-terminal 514.

As shown in FIG. 5, the ADC 501 also includes a feedback-current-block 539. The feedback-current-block 539 is used to provide feedback current to the first-amplifier-first-input-terminal 508 and the first-amplifier-second-input-terminal 510.

The feedback-current-block 539 includes a first-feedback-transistor 541, a second-feedback-transistor 542, a first-feedback-switch 544, a second-feedback-switch 546, a first-feedback-current-source 548, and a second-feedback-current-source 550.

The first-feedback-transistor 541 has a conduction channel that is connected in series between: (i) the first-amplifier-first-input-terminal 508; and (ii) a first terminal of the first-feedback-switch 544. A second terminal of the first-feedback-switch 544 is connected to a first terminal of the first-feedback-current-source 548. A second terminal of the first-feedback-current-source 548 is connected to a reference-terminal (in this example ground). In this way, each of the following components is connected in series between the first-amplifier-first-input-terminal 508 and the reference-terminal: the conduction channel of the first-feedback-transistor 541; the first-feedback-switch 544; and the first-feedback-current-source 548. More particularly, in this example the first-feedback-switch 544 and the first-feedback-current-source 548 are both connected in series between: (i) a first terminal of the conduction channel of the first-feedback-transistor 541; and (ii) the reference-terminal. A second (the other) terminal of the conduction channel of the first-feedback-transistor 541 is connected to the first-amplifier-first-input-terminal 508.

The conduction channel of the first-feedback-transistor 541 is used to convey the current from the first-feedback-current-source 548. The conduction channel can also sustain the high voltage that is present at the first-amplifier-first-input-terminal 508, while enabling the first-feedback-switch 544 and the first-feedback-current-source 548 to operate in the low voltage domain.

The control terminal (in this example the gate) of the first-feedback-transistor 541 is connected to a reference voltage, as is known in the art. The first-feedback-transistor 541 can be provided as an nmos field effect transistor (FET) that is capable of handling high voltages. For instance, the nmos FET may be capable of handling high voltages from its drain to its source ($V_{DS}$) and/or from its gate to its source ($V_{GS}$). In other examples the first-feedback-transistor 541 can be provided as bipolar junction transistor (BJT).

In this example, the first-feedback-transistor 541 and the first-feedback-current-source 548 can be considered as a cascode. The cascode includes both a high voltage device (the first-feedback-transistor 541) and a low voltage device (first-feedback-current-source 548). The high voltage device (the first-feedback-transistor 541) is used to protect the low voltage device (first-feedback-current-source 548) under it. Using a cascode can be advantageous because it can enable a low voltage device to be used in combination with a high voltage device. Using the low voltage device can enable good matching to be achieved, and therefore a relatively low (undesired) offset. Using the high voltage device can provide the required functionality of sustaining the high voltage at the first-amplifier-first-input-terminal 508.

There is a similar arrangement of components connected to the first-amplifier-second-input-terminal 510. The second-feedback-transistor 542 has a conduction channel that is connected in series between: (i) the first-amplifier-second-input-terminal 510; and (ii) a first terminal of the second-feedback-switch 546. A second terminal of the second-feedback-switch 546 is connected to a first terminal of the second-feedback-current-source 550. A second terminal of the second-feedback-current-source 550 is connected to a reference-terminal (in this example ground). In this way, each of the following components is connected in series between the first-amplifier-second-input-terminal 510 and the reference-terminal: the conduction channel of the second-feedback-transistor 542; the second-feedback-switch 546; and the second-feedback-current-source 550. More particularly, in this example the second-feedback-switch 546 and the second-feedback-current-source 550 are both connected in series between: (i) a first terminal of the conduction channel of the second-feedback-transistor 542; and (ii) the reference-terminal. A second (the other) terminal of the conduction channel of the second-feedback-transistor 542 is connected to the first-amplifier-second-input-terminal 510.

The conduction channel of the second-feedback-transistor 542 is used to convey the current from the second-feedback-current-source 550. The conduction channel can also sustain the high voltage that is present at the second-amplifier-first-input-terminal 510, while enabling the second-feedback-switch 546 and the second-feedback-current-source 550 to operate in the low voltage domain. The second-feedback-transistor 542 can be implemented in the same way as the first-feedback-transistor 541 is described above. That is, the second-feedback-transistor 542 can be provided as an nmos field effect transistor (FET) that is capable of handling high voltages. Also, the second-feedback-transistor 542 and the second-feedback-current-source 550 can be considered as a cascode.

The first-feedback-switch 544 and the second-feedback-switch 546 are both operated in accordance with the state of the output-digital-signal (Bitstream). More particularly, when the output-digital-signal is in a first state (e.g. digital 1), the first-feedback-switch 544 is closed and the second-feedback-switch 546 is open. Similarly, when the output-digital-signal is in a second state (e.g. digital 0), the first-feedback-switch 544 is open and the second-feedback-switch 546 is closed.

As shown schematically in the drawing, one terminal of the conduction channels of each of the first-feedback-transistor 541 and the second-feedback-transistor 542 are connected to high voltage signals (the terminals that are connected to the corresponding first-amplifier-input-terminal 508, 510 of the amplifier stage 506), and the other terminals are connected to low voltage signals (the terminals that are connected to the corresponding feedback-current-sources 548, 550). Therefore, the first-feedback-transistor 541 and the second-feedback-transistor 542 are designed such that they are sufficiently robust such that they can withstand the high input common-mode voltages that can be present at the first-amplifier-input-terminals 508, 510 of the first-amplifier-stage 506.

Advantageously, no additional current is pulled down through the first-input-resistor 516 and the second-input-resistor 518 in FIG. 5, as is the case in the circuit of FIG. 4. This can be avoided because the level shifting from high voltage to low voltage is not performed across the input-resistors 516, 518. Additional advantages of the ADC 501 of FIG. 5 can include:

Inherent anti-aliasing. This is an inherent property of the continuous-time sigma delta ADC because the input signal is continuously integrated and no sampling is performed;

High-common mode voltages are sustainable; and

Good robustness in terms of electrostatic discharge (ESD) and electromagnetic compatibility (EMC), which can be due to the first-input-resistor 516 and the second-input-resistor 518.

In this way, the ADC 501 can be implemented in such a way that high common-mode voltages can be sustained on the inputs of the first amplifier-stage 506 within the ADC 501. The inputs of the first amplifier-stage (integrator) 506 can be lower than the voltage at the input-terminals 500, 502 by a few volts; the exact value will depend on the size of the input-resistors 516, 518 and the level of the feedback current that is provided by the feedback-current-sources 548, 550. As will be described below, the high-voltage to low-voltage common-mode level shifting is performed inside the first-amplifier-stage 506: the voltage drop is absorbed by a biasing current source of the differential pair inside the first-amplifier-stage 506, the differential pair of the firstamplifier-stage 506 itself, and the integration-capacitors 538, 540 of the first-amplifier-stage 506.

Figure 6:
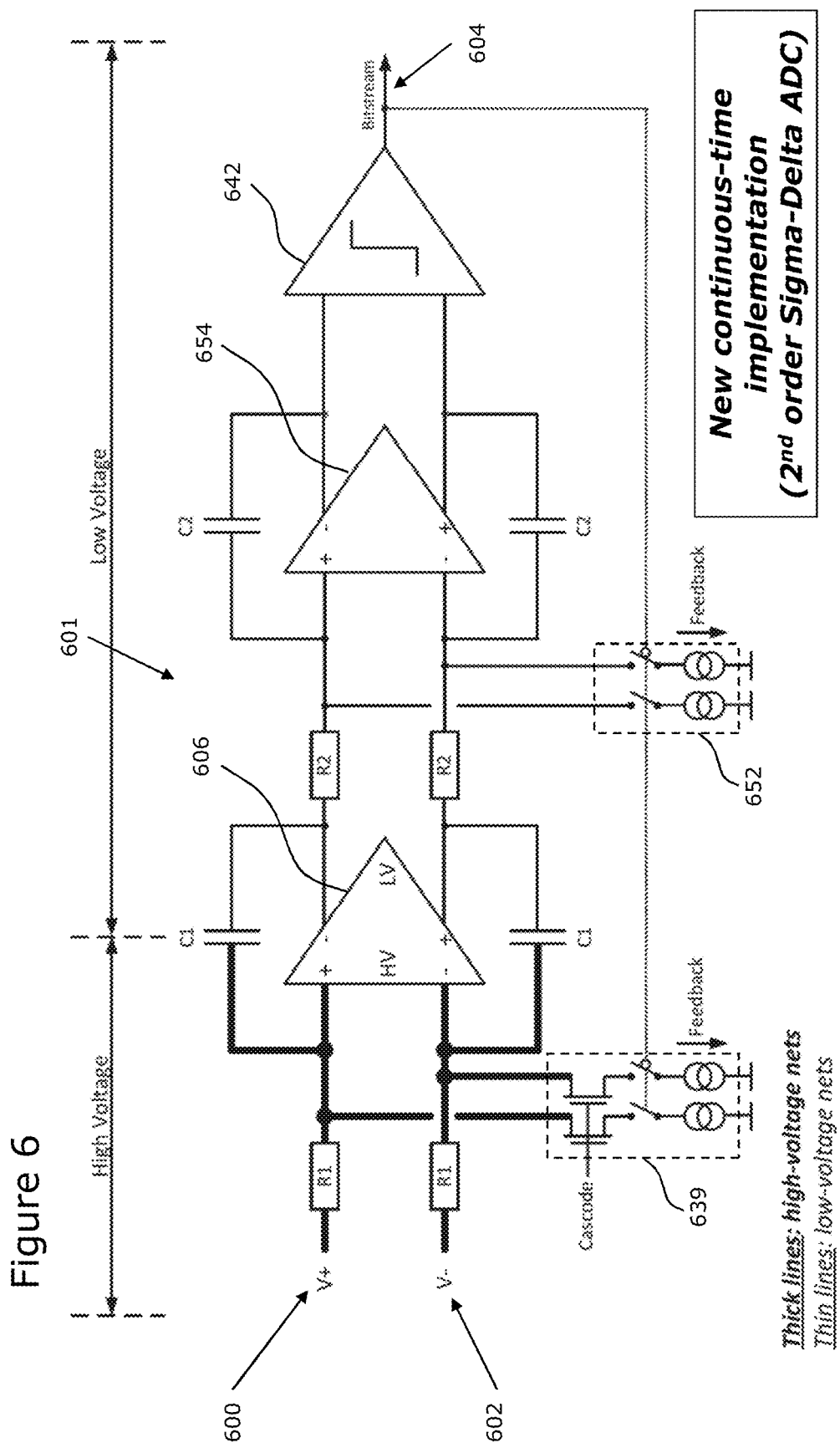
FIG. 6 shows another example embodiment of a second order sigma-delta ADC.

FIG. 6 shows another example embodiment of a sigma-delta ADC 601. Features of FIG. 6 that are also in FIG. 5 have been given corresponding reference numbers in the 600 series, and will not necessarily be described in detail again here.

The sigma-delta ADC 601 of FIG. 6 is a second order ADC because it has a first-amplifier-stage 606 and also a second-amplifier-stage 654. The first-amplifier-stage 606 and the second-amplifier-stage 654 (and in other examples one or more further amplifier-stages) are provided in series with each other between (i) the input terminals of the ADC (the first-input-terminal 600 and the second-input-terminal 602), and (ii) the threshold-block 642. It can be seen from FIG. 6 that the second-amplifier-stage 654 only needs to handle low voltage signals (because the branches of the circuit that are associated with the second-amplifier-stage 654 are all illustrated with thin lines). This is because the voltage levels are shifted in the first-amplifier-stage 506, as discussed above.

As shown in FIG. 6, the ADC 601 also includes a second-feedback-current-block 652. The second-feedback-current-block 652 is used to provide feedback current to the input-terminals of the second-amplifier-stage 654.

In contrast to the feedback-current block 639, the second-feedback-current-block 652 does not includes feedback-transistors, and therefore does not include cascodes. This is because second-feedback-current-block 652 does not need to accommodate any high voltage signals at the input-terminals of the second-amplifier-stage 654. Apart from this, the second-feedback-current-block 652 generally corresponds to the feedback-current block 639 for the first-amplifier-stage 606.

As discussed in detail above, embodiments of the present disclosure relate to a continuous-time sigma-delta ADC that can convert input signals with a high common-mode voltage. The limit of the high voltage may be only defined by what the technology can sustain. Advancements lie in the use of a level-shifting amplifier in the first integrator stage, that has a high-common voltage at its input terminal, and regulates the signal at its output terminal at a low common-mode voltage. This low common-mode voltage can advantageously be compatible with the rest of the circuit. The common-mode level shifting can thus be achieved directly within the sigma-delta loop, and does not significantly contribute to any degradation of the linearity of the ADC. Also, no significant additional current is pulled down from the input resistors.

Figure 7:
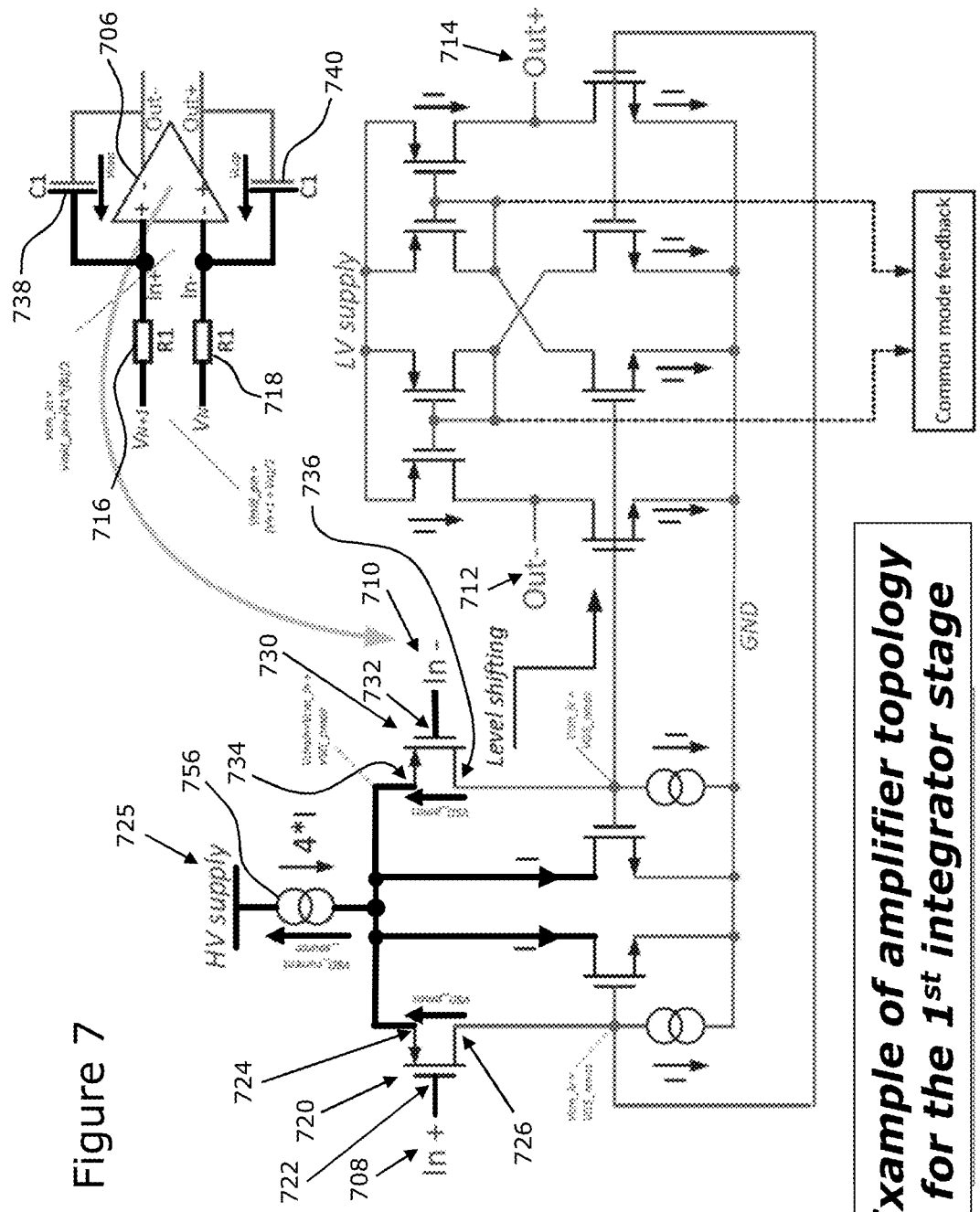
FIG. 7 shows an example amplifier topology that can be used to implement any of the first-amplifier-stages disclosed herein.

FIG. 7 shows an example amplifier topology that can be used to implement any of the first-amplifier-stages disclosed herein. It will be appreciated that the topology that is shown in FIG. 7 is merely one way in which the first-amplifier-stage can be implemented. What is important is that it can level-shift the common-mode voltage of the input signals in order to provide a low voltage output signal.

Two of the key components of the amplifier topology of FIG. 7 are the first-amplifier-first-transistor 720 and the first-amplifier-second-transistor 730. As will be discussed in detail below, these transistors 720, 730 contribute to the level shifting from a high voltage to a low voltage in the first-amplifier-stage. The skilled person will appreciate from the present disclosure that any amplifier topology can be used that has an appropriate pair of transistors (here the first-amplifier-first-transistor 720 and the first-amplifier-second-transistor 730) for level shifting from a high voltage to a low voltage. Any combination of components that are known in the art can be provided downstream of these transistors in order to provide the functionality of the amplifier stage. Furthermore, advantageously these downstream components can all operate in the low voltage domain.

The first-amplifier-first-transistor 720 in this example is provided as a pmos FET device. In other examples it can be provided as bipolar junction transistor (BJT). The first-amplifier-first-transistor 720 has: a control-terminal 722 (in this example a gate), a first-conduction-channel-terminal 724 (in this example a source); and a second-conduction-channel-terminal 726 (in this example a drain). The control-terminal 722 is connected to the first-amplifier-first-input-terminal 708, and is configured to receive a high-voltage first-amplifier-first-input-signal. Example definitions of what constitutes a high voltage are provided above. The first-conduction-channel-terminal 724 is configured to be connected to a high-voltage supply 725. The high-voltage supply 725 may be provided as the voltage across the entire stack of individual cells (as shown in FIG. 3) in some examples. The second-conduction-channel-terminal 726 is configured to provide a low-voltage signal for setting the voltage at the first-amplifier-first-output-terminal 712. Again, example definitions of a low voltage are provided above.

Implementing the first-amplifier-first-transistor 720 as a mosfet can be advantageous because there is little or no gate current through it. Using a pmos can also be beneficial because it can represent a more straightforward way to cause the drain currents to flow towards the ground, where the low voltage circuitry is located.

The first-amplifier-second-transistor 730 in this example is also provided as a pmos FET device, although could be provided as a BJT. The first-amplifier-second-transistor 730 has: a control-terminal 732; a first-conduction-channel-terminal 734; and a second-conduction-channel-terminal 736. The control-terminal 732 is connected to the first-amplifier-second-input-terminal 710, and is configured to receive a high-voltage first-amplifier-second-input-signal. The first-conduction-channel-terminal 734 is configured to be connected to a high-voltage supply 725. The second-conduction-channel-terminal 736 is configured to provide a low-voltage signal for setting the voltage at the first-amplifier-second-output-terminal 714.

In a similar way to that described above with reference to the first-feedback-transistor and the second-feedback-transistor of FIG. 5, the conduction channels of the first-amplifier-first-transistor 720 and the first-amplifier-second-transistor 730 of FIG. 7 can sustain the high voltages that are present at their control-terminals 722, 732 and first-conduction-channel-terminals 724, 734, while enabling the second-conduction-channel-terminals 726, 736 to operate in the low voltage domain.

Optionally, the first-amplifier-first-transistor 720 and the first-amplifier-second-transistor 730 can each be provided as a cascoded structure. Each cascoded structure can include both a high voltage device and a low voltage device. These devices may be transistors, such as pmos FETs. Therefore, in this example, the first-amplifier-first-transistor 720 can be referred to as a the first-amplifier-first-cascode, and the first-amplifier-second-transistor 730 can be referred to as a first-amplifier-second-cascode. Using a cascode can also be advantageous here because it can enable a low voltage device to provide advantages in terms of good matching, whilst still benefitting from a high voltage device that can provide the required functionality of sustaining the high voltage.

In this example, the first-amplifier-first-transistor 720 and the first-amplifier-second-transistor 730 are provided as a differential pair of transistors.

As shown in FIG. 7, a current source 756 is connected between the high-voltage supply 725 and a node that joins: (i) the first-conduction-channel-terminal 724; and (ii) the first-conduction-channel-terminal 734. The current source 756 also operates in the high voltage domain in this example.

With reference to FIG. 7, the high voltage distribution across the first-amplifier-stage can be represented as:

Input common mode before the input-resistors 716, 718:

$$V_{mid\_pin} = \frac{(V_{n+1} + V_n)}{2}$$

Input common mode voltage of the first-amplifier-stage 706: $V_{cm\_in} = V_{mid\_pin} - (R_1 \times I_{fb})/2$ Voltage at the drain of the current source 756 biasing the differential pair of pmos transistors 720, 730: $V_{drain} = V_{cm\_in} + V_{SG\_pmos}$ Common mode level in the low voltage section (at the second-conduction-channel-terminals 726, 736 of the differential pair of pmos transistors 720, 730: $V_{cm\_lv} = V_{GS\_nmos}$ The following components absorb the high voltage in the structure of FIG. 7:

The current source 756: $V_{SD\_current\_source} = HV_{sup} - V_{drain}$ (range: 1V-90V in this example)

Differential pair of pmos transistors 720, 730: $V_{SD\_pmos} = V_{drain} - V_{cm\_in}$ (range: 1V-90V in this example)

Integration-capacitors 738, 740: $V_{cap} = V_{cm\_in} - V_{cm\_lv}$ (range: 0-90V in this example)

Advantageously, very few of the components in the first-amplifier-stage are exposed to high voltage signals.

The ADC of FIG. 6 using the topology of FIG. 7 for the first-amplifier-stage was implemented on a test chip (90 nm technology) and tested for validating the performances. For this test, the high voltage was limited to 40V.

Figure 8:
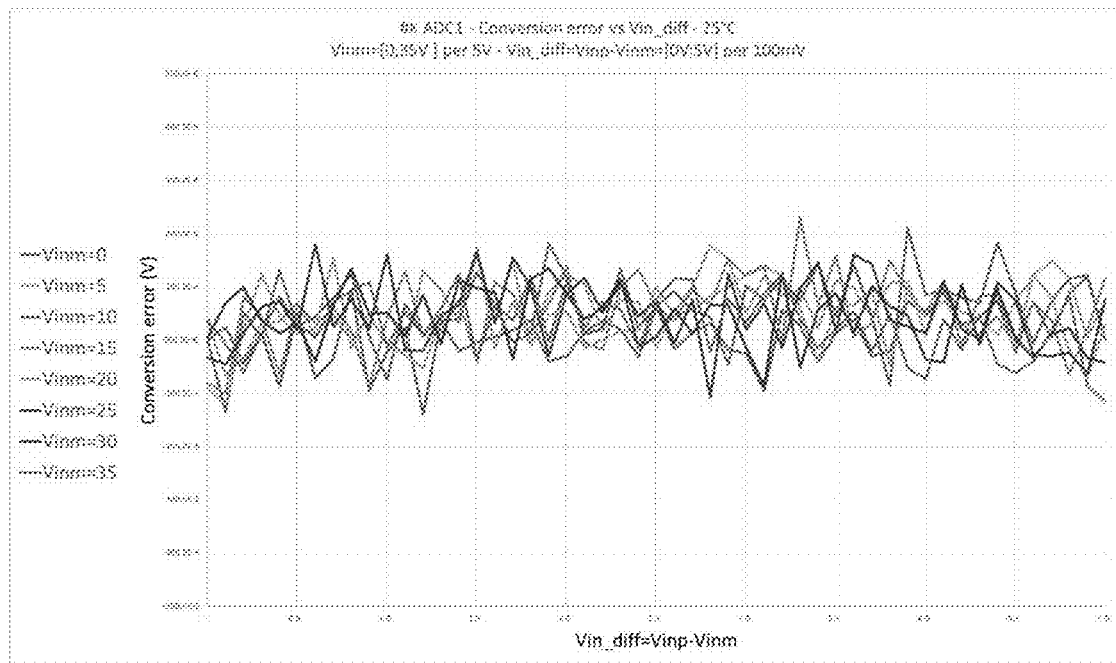
FIG. 8 shows a first set of performance results for a test chip incorporating an ADC of the present disclosure.

FIG. 8 shows, for the test chip identified above, the error conversion for a differential voltage of 0 to 5V and a common mode voltage from 0 to 40V (OSR=2048). FIG. 8 shows good performance in that the maximum error is less than 250 µV.

Figure 9:
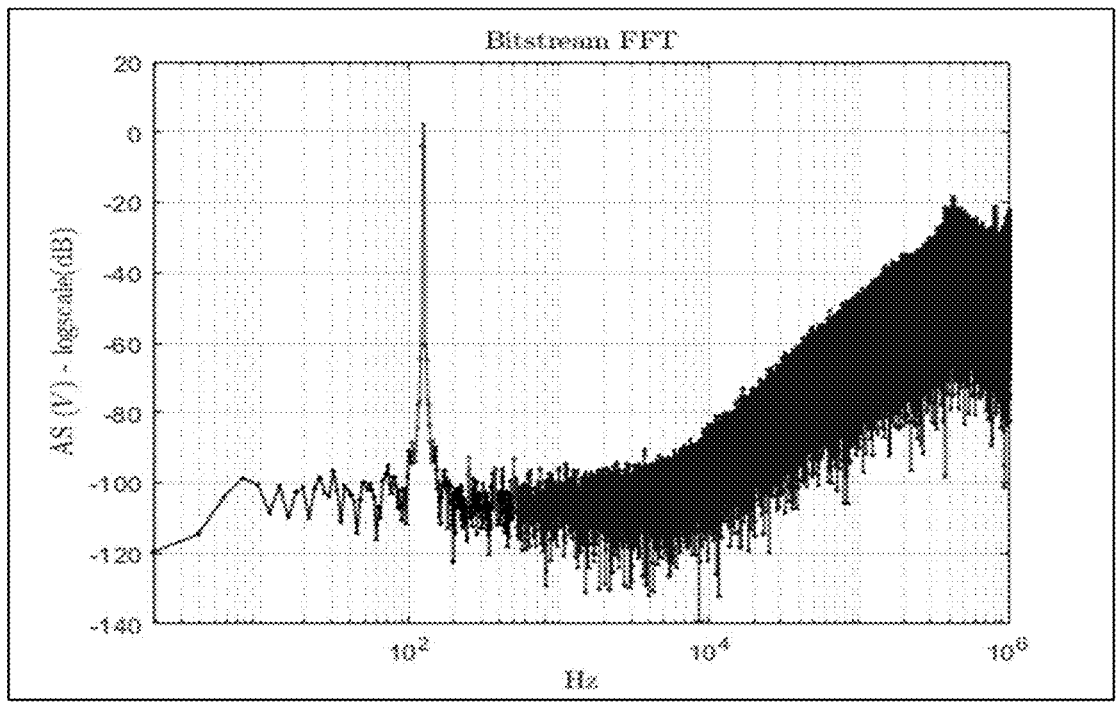
FIG. 9 shows a second set of performance results for a test chip incorporating an ADC of the present disclosure.

FIG. 9 shows, for the test chip identified above, the bitstream FFT with an in-band tone and SFDR/THD. FIG. 9 shows excellent dynamic performance and accuracy. The bitstream FFT also shows a very clean spurious response and a low noise floor at around −100 dB.

Examples described herein can advantageously use a continuous-time sigma-delta ADC with high common-mode voltage inputs. This performance can be obtained by using a topology that level shifts the voltage across the first amplifier. These examples can require fewer components than other implementations, and can also provide advantages in terms of safety. Safety can be improved due to the reduction of external components when compared with a discrete-time sigma-delta ADC (because RC filters are not required), which leads to a lower likelihood of failures. Moreover it is no longer necessary to perform diagnosis on these external components, since they are simply not required for embodiments of the present disclosure. Such examples can be used with any voltage measurement circuits where a high-common mode voltage can be present, e.g. for stacked batteries (specifically the case of electric vehicles).

The implementation of a continuous-time sigma-delta converter that is described herein can be directly tied to individual battery cells. The converter can perform both: (i) the high voltage to low voltage level shifting; and (ii) the Analog to Digital Conversion of the cell voltage. An advantage of such approach is that since there is no sampling of the input signal, no external anti-aliasing RC filter may be required, which can considerably simplify integration at application level and also reduces the Bill of Material cost. In this way, both the internal circuitry and the board level circuitry can be kept to a minimum.

It will be appreciated that any components that are described or illustrated herein as being coupled or connected could be directly or indirectly coupled or galvanically connected. That is, one or more components could be located between two components that are said to be coupled or connected whilst still enabling the required functionality to be achieved.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:
1. A sigma-delta ADC comprising:
a first-input-terminal configured to receive a first-high-voltage-analogue-input-signal;
a second-input-terminal configured to receive a second-high-voltage-analogue-input-signal;
an output-terminal configured to provide an output-digital-signal, wherein the output-digital-signal is representative of the difference between the first-high-voltage-analogue-input-signal and the second-high-voltage-analogue-input-signal;
a first-amplifier-stage comprising:
    a first-amplifier-first-input-terminal;
    a first-amplifier-second-input-terminal;
    a first-amplifier-first-output-terminal;
    a first-amplifier-second-output-terminal;
    a first-input-resistor connected in series between the first-input-terminal and the first-amplifier-first-input-terminal;
    a second-input-resistor connected in series between the second-input-terminal and the first-amplifier-second-input-terminal;
    a first-amplifier-first-transistor comprising:
        a control-terminal, that is connected to the first-amplifier-first-input-terminal and is configured to receive a high-voltage first-amplifier-first-input-signal;
        a first-conduction-channel-terminal, that is configured to be connected to a high-voltage supply;
        a second-conduction-channel-terminal, that is configured to provide a low-voltage signal for setting the voltage at the first-amplifier-first-output-terminal;
    a first-amplifier-second-transistor comprising:
        a control-terminal, that is connected to the first-amplifier-second-input-terminal and is configured to receive a high-voltage first-amplifier-second-input-signal;
        a first-conduction-channel-terminal, that is configured to be connected to a high-voltage supply;
        a second-conduction-channel-terminal, that is configured to provide a low-voltage signal for setting the voltage at the first-amplifier-second-output-terminal; and
    a first-integration-capacitor connected between the first-amplifier-first-output-terminal and the first-amplifier-first-input-terminal;
    a second-integration-capacitor connected between the first-amplifier-second-output-terminal and the first-amplifier-second-input-terminal;
a threshold-block that is configured to:
    receive signals from the first-amplifier-first-output-terminal and the first-amplifier-second-output-terminal; and
    provide the output-digital-signal to the output-terminal; and
a feedback-current-block, which comprises:
    a first-feedback-transistor having a conduction channel;
    a second-feedback-transistor having a conduction channel;
    a first-feedback-switch;
    a second-feedback-switch;
    a first-feedback-current-source; and
    a second-feedback-current-source;
wherein:
    each of the following components is connected in series between the first-amplifier-first-input-terminal and a reference-terminal: the conduction channel of the first-feedback-transistor; the first-feedback-switch; and the first-feedback-current-source; and
    each of the following components is connected in series between the first-amplifier-second-input-terminal and the reference-terminal: the conduction channel of the second-feedback-transistor; the second-feedback-switch; and the second-feedback-current-source.

2. The sigma-delta ADC of claim 1, wherein a high voltage is a voltage that is greater than or equal to 10V, 40V, 80V or 120V.

3. The sigma-delta ADC of claim 1, wherein a low voltage is a voltage that is less than or equal to 5V, 3V, 1.8V or 1V.

4. The sigma-delta ADC of claim 1, wherein:
the first-feedback-transistor comprises a high voltage device; and
the first-feedback-current-source comprises a low voltage device.

5. The sigma-delta ADC of claim 4, wherein:
the low voltage device is one that is suitable for handling a low voltage signal, and a low voltage is a voltage that is less than or equal to 5V, 3V, 1.8V or 1V; and
the high voltage device is one that is capable of handling a high voltage signal, and a high voltage is a voltage that is greater than or equal to 10V, 40V, 80V or 120V.

6. The sigma-delta ADC of claim 1, wherein:
the second-feedback-transistor comprises a high voltage device; and
the second-feedback-current-source comprises a low voltage device.

7. The sigma-delta ADC of claim 1, wherein:
the first-amplifier-first-transistor comprises a first-amplifier-first-cascode; and
the first-amplifier-second-transistor comprises a first-amplifier-second-cascode.

8. The sigma-delta ADC of claim 7, wherein:
the low voltage device is one that is suitable for handling a low voltage signal, and a low voltage is a voltage that is less than or equal to 5V, 3V, 1.8V or 1V; and
the high voltage device is one that is capable of handling a high voltage signal, and a high voltage is a voltage that is greater than or equal to 10V, 40V, 80V or 120V.

9. The sigma-delta ADC of claim 1, wherein:
the first-amplifier-first-cascode comprises a high voltage device and a low voltage device; and
the first-amplifier-second-cascode comprises a high voltage device and a low voltage device.

10. The sigma-delta ADC of claim 1, wherein the first-amplifier-first-transistor and the first-amplifier-second-transistor are provided as a differential pair.

11. The sigma-delta ADC of claim 1, wherein:
the first-amplifier-first-transistor comprises a pmos FET; and
the first-amplifier-second-transistor comprises a pmos FET.

12. The sigma-delta ADC of claim 11, wherein:
the low voltage device is one that is suitable for handling a low voltage signal; and
the high voltage device is one that is capable of handling a high voltage signal.

13. The sigma-delta ADC of claim 1, wherein:
the first-feedback-transistor comprises a nmos FET; and
the second-feedback-transistor comprises a nmos FET.

14. The sigma-delta ADC of claim 13, wherein a high voltage is a voltage that is greater than or equal to 10V, 40V, 80V or 120V.

15. The sigma-delta ADC of claim 13, wherein a low voltage is a voltage that is less than or equal to 5V, 3V, 1.8V or 1V.

16. The sigma-delta ADC of claim 1, wherein:
the first-feedback-switch and the first-feedback-current-source are both connected in series between: (i) a first terminal of the conduction channel of the first-feedback-transistor; and (ii) the reference-terminal;
a second terminal of the conduction channel of the first-feedback-transistor is connected to the first-amplifier-first-input-terminal;
the second-feedback-switch and the second-feedback-current-source are both connected in series between: (i) a first terminal of the conduction channel of the second-feedback-transistor; and (ii) the reference-terminal; and
a second terminal of the conduction channel of the second-feedback-transistor is connected to the first-amplifier-second-input-terminal.

17. The sigma-delta ADC of claim 1, wherein the sigma-delta ADC is a continuous-time ADC.

18. The sigma-delta ADC of claim 1, further comprising one or more further amplifier-stages provided in series with the first-amplifier-stage between (i) the first-input-terminal and the second-input-terminal, and (ii) the threshold-block.

19. A battery management system for a vehicle, wherein the battery management system comprises a sigma-delta ADC, wherein the sigma-delta ADC comprises;
a first-input-terminal configured to receive a first-high-voltage-analogue-input-signal;
a second-input-terminal configured to receive a second-high-voltage-analogue-input-signal;
an output-terminal configured to provide an output-digital-signal, wherein the output-digital-signal is representative of the difference between the first-high-voltage-analogue-input-signal and the second-high-voltage-analogue-input-signal;
a first-amplifier-stage comprising:
a first-amplifier-first-input-terminal;
a first-amplifier-second-input-terminal;
a first-amplifier-first-output-terminal;
a first-amplifier-second-output-terminal;
a first-input-resistor connected in series between the first-input-terminal and the first-amplifier-first-input-terminal;
a second-input-resistor connected in series between the second-input-terminal and the first-amplifier-second-input-terminal;
a first-amplifier-first-transistor comprising:
a control-terminal, that is connected to the first-amplifier-first-input-terminal and is configured to receive a high-voltage first-amplifier-first-input-signal;
a first-conduction-channel-terminal, that is configured to be connected to a high-voltage supply;
a second-conduction-channel-terminal, that is configured to provide a low-voltage signal for setting the voltage at the first-amplifier-first-output-terminal;
a first-amplifier-second-transistor comprising:
a control-terminal, that is connected to the first-amplifier-second-input-terminal and is configured to receive a high-voltage first-amplifier-second-input-signal;
a first-conduction-channel-terminal, that is configured to be connected to a high-voltage supply;
a second-conduction-channel-terminal, that is configured to provide a low-voltage signal for setting the voltage at the first-amplifier-second-output-terminal; and
a first-integration-capacitor connected between the first-amplifier-first-output-terminal and the first-amplifier-first-input-terminal;
a second-integration-capacitor connected between the first-amplifier-second-output-terminal and the first-amplifier-second-input-terminal;
a threshold-block that is configured to:
receive signals from the first-amplifier-first-output-terminal and the first-amplifier-second-output-terminal; and
provide the output-digital-signal to the output-terminal; and
a feedback-current-block, which comprises:
a first-feedback-transistor having a conduction channel;
a second-feedback-transistor having a conduction channel;
a first-feedback-switch;
a second-feedback-switch;
a first-feedback-current-source; and
a second-feedback-current-source;
wherein:
each of the following components is connected in series between the first-amplifier-first-input-terminal and a reference-terminal: the conduction channel of the first-feedback-transistor; the first-feedback-switch; and the first-feedback-current-source; and
each of the following components is connected in series between the first-amplifier-second-input-terminal and the reference-terminal: the conduction channel of the second-feedback-transistor; the second-feedback-switch; and the second-feedback-current-source.

20. A vehicle comprising a battery management system, wherein the battery management system comprises a sigma-delta ADC, wherein the sigma-delta ADC comprises:
a first-input-terminal configured to receive a first-high-voltage-analogue-input-signal;
a second-input-terminal configured to receive a second-high-voltage-analogue-input-signal;
an output-terminal configured to provide an output-digital-signal, wherein the output-digital-signal is representative of the difference between the first-high-voltage-analogue-input-signal and the second-high-voltage-analogue-input-signal;
a first-amplifier-stage comprising:
a first-amplifier-first-input-terminal;

a first-amplifier-second-input-terminal;
a first-amplifier-first-output-terminal;
a first-amplifier-second-output-terminal;
a first-input-resistor connected in series between the first-input-terminal and the first-amplifier-first-input-terminal;
a second-input-resistor connected in series between the second-input-terminal and the first-amplifier-second-input-terminal;
a first-amplifier-first-transistor comprising:
   a control-terminal, that is connected to the first-amplifier-first-input-terminal and is configured to receive a high-voltage first-amplifier-first-input-signal;
   a first-conduction-channel-terminal, that is configured to be connected to a high-voltage supply;
   a second-conduction-channel-terminal, that is configured to provide a low-voltage signal for setting the voltage at the first-amplifier-first-output-terminal;
a first-amplifier-second-transistor comprising:
   a control-terminal, that is connected to the first-amplifier-second-input-terminal and is configured to receive a high-voltage first-amplifier-second-input-signal;
   a first-conduction-channel-terminal, that is configured to be connected to a high-voltage supply;
   a second-conduction-channel-terminal, that is configured to provide a low-voltage signal for setting the voltage at the first-amplifier-second-output-terminal; and
a first-integration-capacitor connected between the first-amplifier-first-output-terminal and the first-amplifier-first-input-terminal;
a second-integration-capacitor connected between the first-amplifier-second-output-terminal and the first-amplifier-second-input-terminal;
a threshold-block that is configured to:
   receive signals from the first-amplifier-first-output-terminal and the first-amplifier-second-output-terminal; and
   provide the output-digital-signal to the output-terminal; and
a feedback-current-block, which comprises:
   a first-feedback-transistor having a conduction channel;
   a second-feedback-transistor having a conduction channel;
   a first-feedback-switch;
   a second-feedback-switch;
   a first-feedback-current-source; and
   a second-feedback-current-source;
wherein:
   each of the following components is connected in series between the first-amplifier-first-input-terminal and a reference-terminal: the conduction channel of the first-feedback-transistor; the first-feedback-switch; and the first-feedback-current-source; and
   each of the following components is connected in series between the first-amplifier-second-input-terminal and the reference-terminal: the conduction channel of the second-feedback-transistor; the second-feedback-switch; and the second-feedback-current-source.

\* \* \* \* \*